United States Patent
Shimamura

(10) Patent No.: US 12,112,103 B2
(45) Date of Patent: Oct. 8, 2024

(54) WORK AREA ZONE BOUNDARY DEMARCATION APPARATUS OF AUTONOMOUSLY NAVIGATING WORK MACHINE

(71) Applicant: Honda Motor Co., Ltd., Tokyo (JP)

(72) Inventor: Hideaki Shimamura, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 618 days.

(21) Appl. No.: 17/287,677

(22) PCT Filed: Nov. 7, 2018

(86) PCT No.: PCT/JP2018/041305
§ 371 (c)(1),
(2) Date: Apr. 22, 2021

(87) PCT Pub. No.: WO2020/095375
PCT Pub. Date: May 14, 2020

(65) Prior Publication Data
US 2021/0397765 A1    Dec. 23, 2021

(51) Int. Cl.
*G06F 30/20* (2020.01)
*G05D 1/00* (2006.01)

(52) U.S. Cl.
CPC .......... *G06F 30/20* (2020.01); *G05D 1/0044* (2013.01); *G05D 1/0219* (2013.01); *G05D 1/0221* (2013.01); *G05D 1/0274* (2013.01)

(58) Field of Classification Search
CPC .... G06F 30/20; G05D 1/0044; G05D 1/0219; G05D 1/0221; G05D 1/0274; G05D 1/0297; G05D 2201/0208
See application file for complete search history.

(56) References Cited

U.S. PATENT DOCUMENTS 5,321,614 A * 6/1994 Ashworth ............ G05D 1/0227
   318/587
2004/0193349 A1 9/2004 Flann et al.
(Continued)

FOREIGN PATENT DOCUMENTS

EP    3175693 A1 * 6/2016 ............... H04Q 9/00
JP   2004139266 A  * 5/2004
(Continued)

OTHER PUBLICATIONS

International Search Report; Application PCT/JP2018/041305; Feb. 5, 2019.
European Search Report; Application eP18939638; Aug. 19, 2021.

*Primary Examiner* — Kandasamy Thangavelu
(74) *Attorney, Agent, or Firm* — Duft & Bornsen, PC

(57) ABSTRACT

A work zone boundary demarcation apparatus to demarcate boundaries that divide a work area (AR) to be serviced by at least one autonomously navigating work machine into multiple zones (ARn), equipped with a computer having at least a processor, a memory, an input-output circuit and a simulation program loaded in the memory to simulate work of the work machine in the work area; wherein the processor is configured to perform as a boundary demarcation unit that demarcates boundaries which divide the work area into multiple zones, a simulation execution unit that executes simulation of work of the work machine in the multiple zones divided by the boundaries demarcated by the boundary demarcation unit, a boundary re-demarcation unit that re-demarcates boundaries demarcated by the boundary demarcation unit based on results of the simulation executed by the simulation execution unit, and a zone display unit that displays the multiple zones divided by the boundaries re-demarcated by the boundary re-demarcation unit.

18 Claims, 11 Drawing Sheets

(56) References Cited

U.S. PATENT DOCUMENTS

| | | | |
|---|---|---|---|
| 2014/0058611 A1 | 2/2014 | Borinato | |
| 2017/0248946 A1 * | 8/2017 | Ogura | A01B 69/008 |
| 2018/0374168 A1 * | 12/2018 | Kano | G06Q 50/08 |
| 2021/0298233 A1 * | 9/2021 | Palla | G05D 1/0219 |

FOREIGN PATENT DOCUMENTS

| | | | | |
|---|---|---|---|---|
| JP | 2005205028 A | | 8/2005 | |
| JP | 2013228821 A | * | 11/2013 | A01D 34/008 |
| JP | 2014230667 A | | 12/2014 | |
| JP | 2016086748 A | | 5/2016 | |
| WO | WO 2014003517 A1 | * | 1/2014 | G05D 1/02 |
| WO | WO 2017170968 A1 | * | 10/2017 | E02F 9/20 |
| WO | WO 2018108178 A1 | * | 6/2018 | A01D 34/008 |

* cited by examiner (i)

(ii)

WORK AREA ZONE BOUNDARY DEMARCATION APPARATUS OF AUTONOMOUSLY NAVIGATING WORK MACHINE

TECHNICAL FIELD

This invention relates to a work area zone boundary demarcation apparatus of an autonomously navigating work machine, namely, an apparatus for demarking boundaries that divide a work area to be serviced by an autonomously navigating work machine into multiple zones.

BACKGROUND ART

Various technologies have been proposed for operating a work machine to autonomously navigate and perform lawn mowing in a designated work area of a garden, golf course or other ground planted with grass (lawn) or to autonomously navigate and perform cleaning work in a designated work area of a floor or the like inside a building. Patent Document 1 can be cited as an example of such a technology. The technology described in Patent Document 1 uses a current-carrying wire to demarcate a work area to be autonomously navigated by a lawnmower work machine.

PRIOR ART DOCUMENT

Patent Document

Patent Document 1: Specification of U.S. Unexamined Patent Application Publication No. 2014/0058611

SUMMARY OF INVENTION

Problem to be Solved by Invention

With regard to such technologies, there sometimes arise cases in which it is more efficient to divide or demarcate the work area into a number of zones and perform work separately in the individual zones. The object of this invention is therefore to provide a work zone boundary demarcation apparatus of an autonomously navigating work machine that achieves improved work efficiency by dividing the work area into multiple zones.

Means for Solving Object

In order to achieve the object, this invention provides a work zone boundary demarcation apparatus to demarcate boundaries that divide a work area to be serviced by at least one autonomously navigating work machine into multiple zones, comprising: a computer having at least a processor, a memory, an input-output circuit and a simulation program loaded in the memory to simulate work of the work machine in the work area; characterized in that the processor is configured to perform as: a boundary demarcation unit that demarcates boundaries which divide the work area into multiple zones, a simulation execution unit that executes simulation of work of the work machine in the multiple zones divided by the boundaries demarcated by the boundary demarcation unit, a boundary re-demarcation unit that re-demarcates boundaries demarcated by the boundary demarcation unit based on results of the simulation executed by the simulation execution unit, and a zone display unit that displays the multiple zones divided by the boundaries re-demarcated by the boundary re-demarcation unit.

DESCRIPTION OF EMBODIMENTS

First Embodiment

Figure 1:
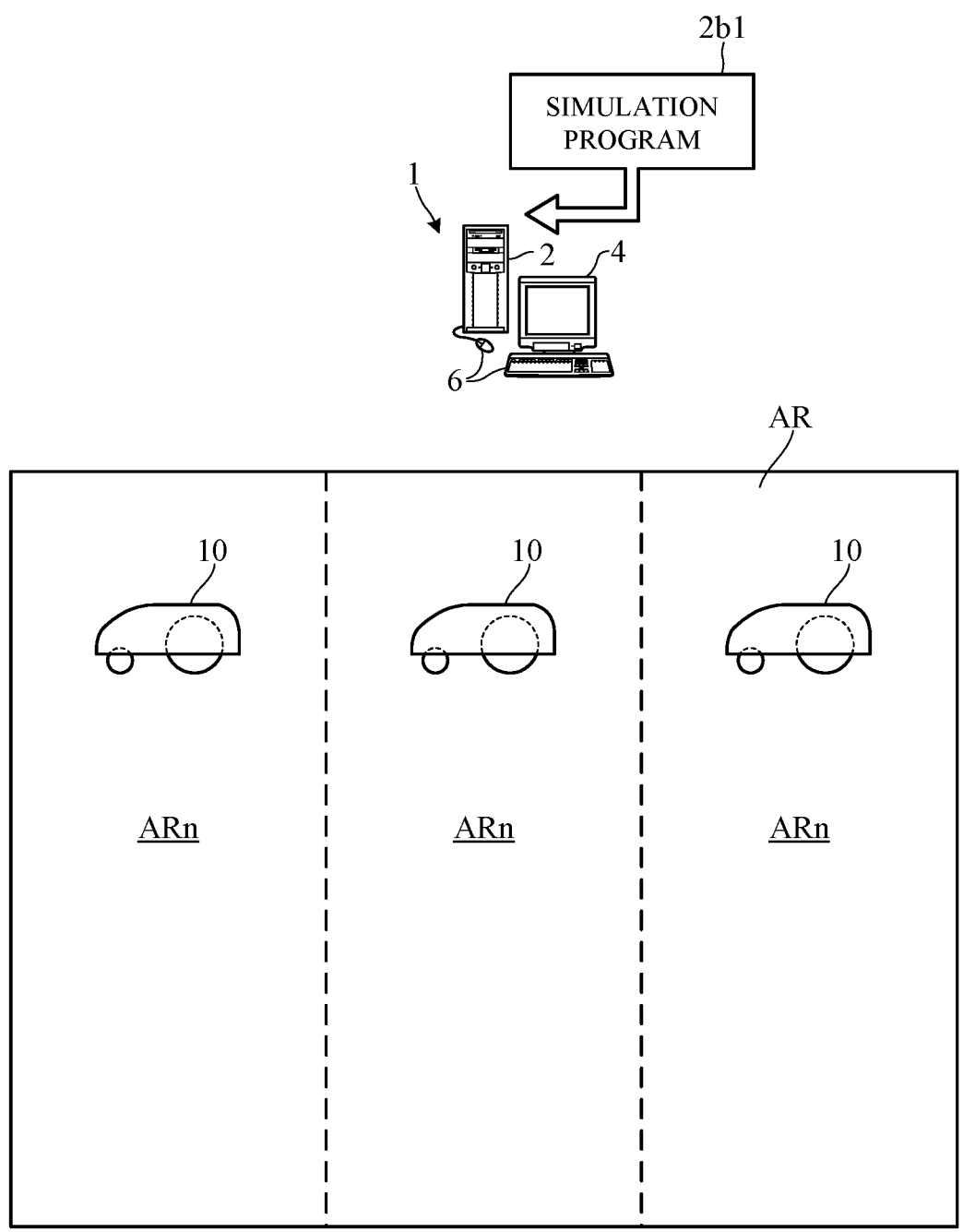
FIG. 1 is a conceptual diagram showing an overview of a work zone boundary demarcation apparatus of an autonomously navigating work machine according to a first embodiment of this invention.
Figure 2:
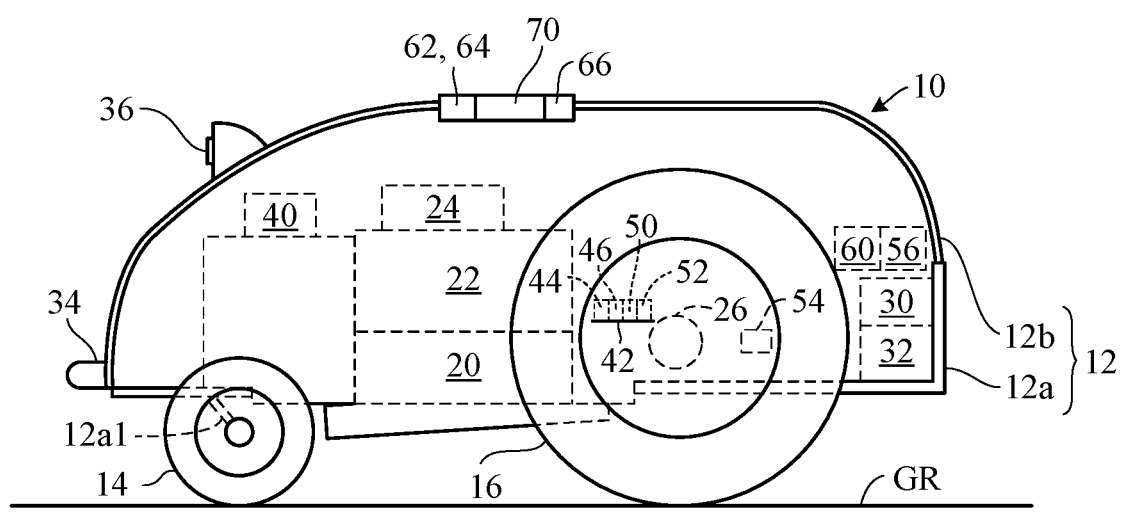
FIG. 2 is an explanatory side view of the autonomously navigating work machine of FIG. 1.
Figure 3:
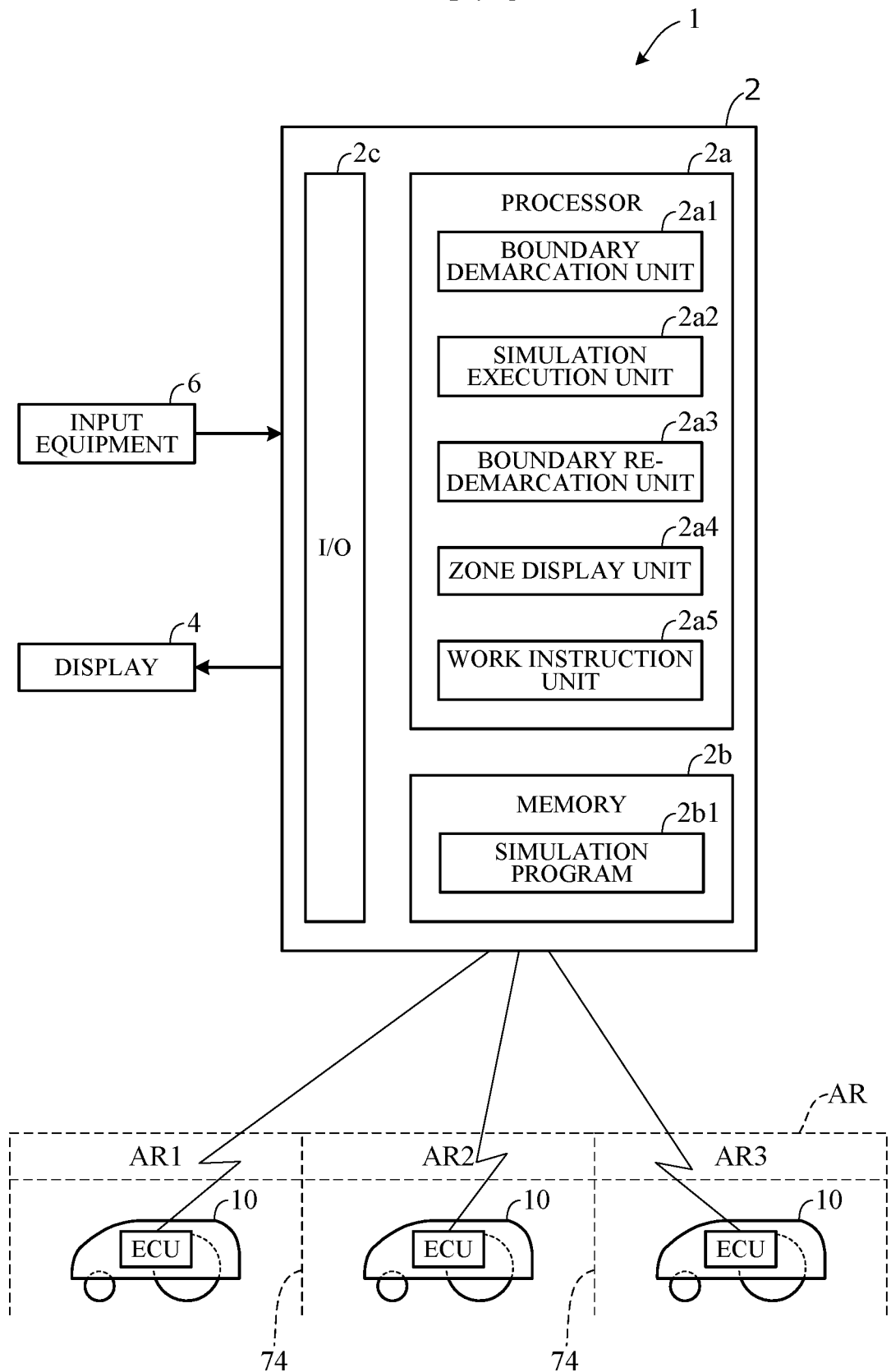
FIG. 3 is an explanatory diagram detailing configuration of a computer of FIG. 1.
Figure 4:
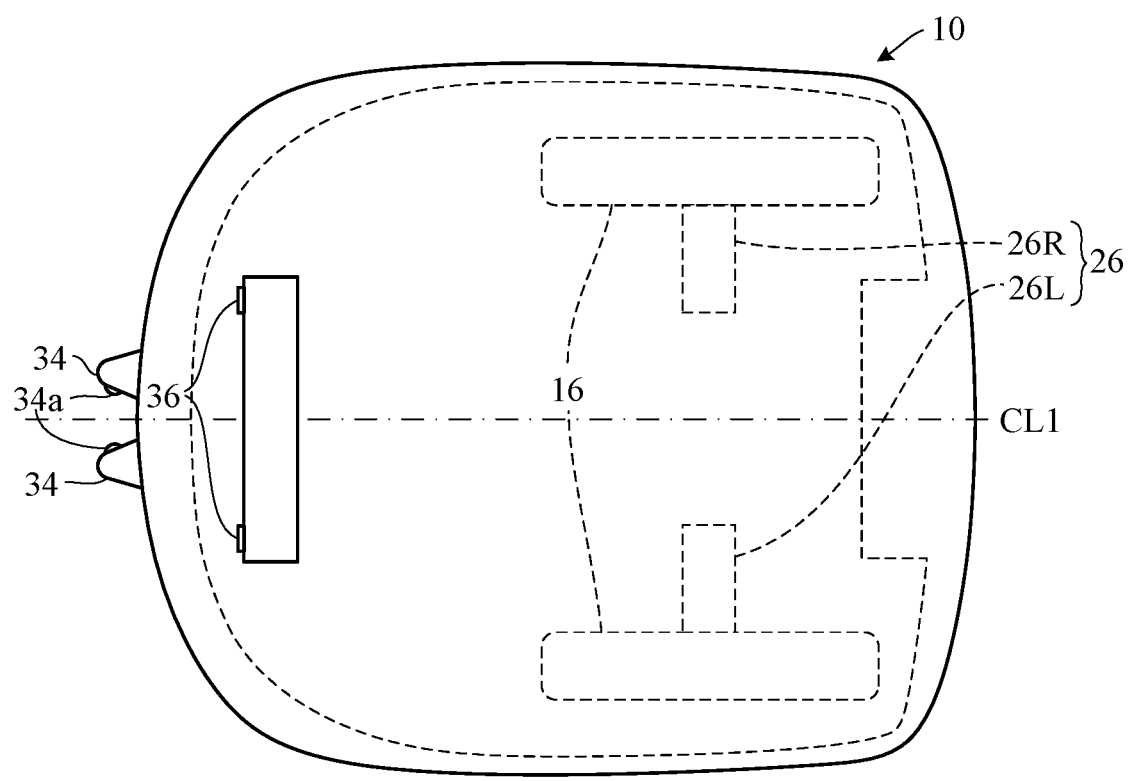
FIG. 4 is a top view of the autonomously navigating work machine of FIG. 2.
Figure 5:
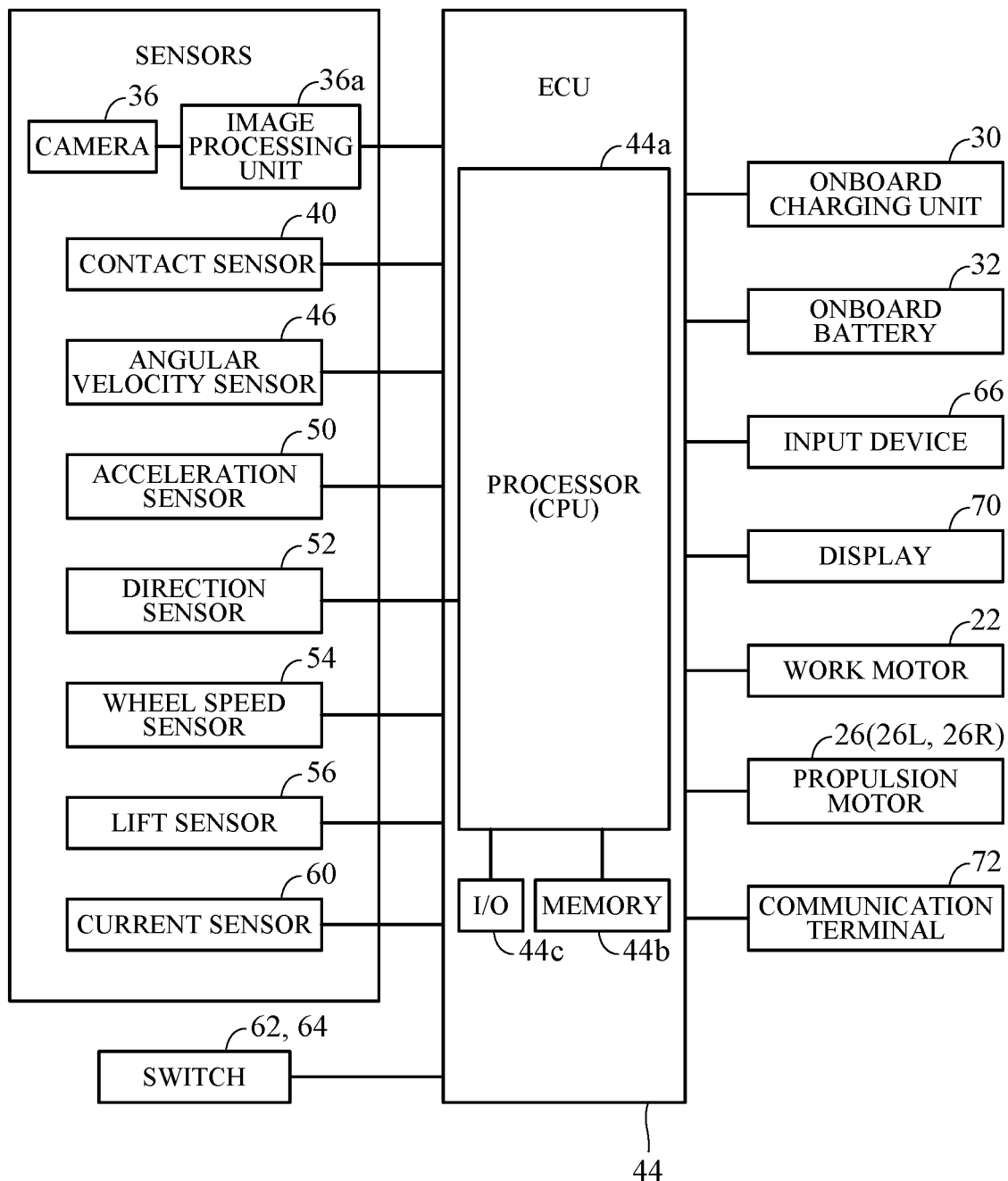
FIG. 5 is a block diagram showing input-output relationships of an ECU of the autonomously navigating work machine of FIG. 2.
Figure 6:
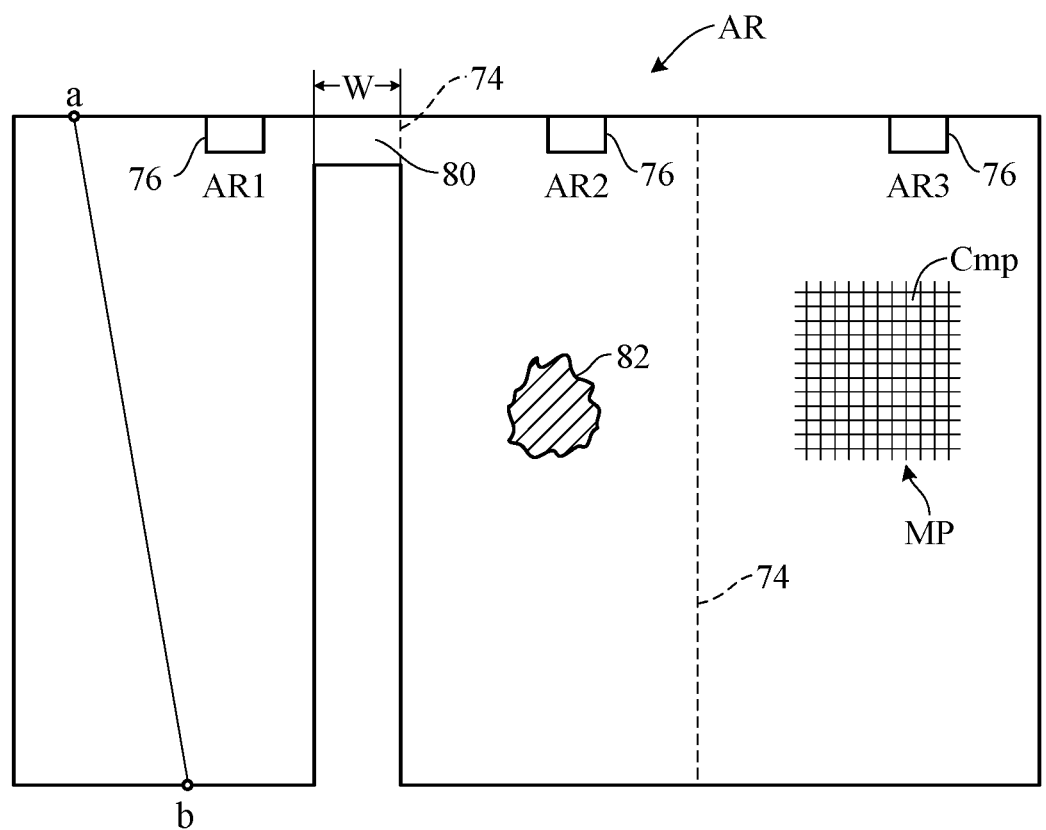
FIG. 6 is an explanatory diagram of a work area to be serviced by the autonomously navigating work machine of FIG. 1.

FIG. 1 is a conceptual diagram showing an overview of a work zone boundary demarcation apparatus of an autonomously navigating work machine according to a first embodiment of this invention; FIG. 2 is an explanatory side view of the autonomously navigating work machine of FIG. 1; FIG. 3 is an explanatory diagram detailing configuration of a computer of FIG. 1; FIG. 4 is a top view of the autonomously navigating work machine of FIG. 2; FIG. 5 is a block diagram showing input-output relationships of an ECU (Electronic Control Unit) of the autonomously navigating work machine of FIG. 2; and FIG. 6 is an explanatory diagram of a work area to be serviced by the autonomously navigating work machine of FIG. 1.

Reference numeral 1 in FIG. 1 designates a work zone boundary demarcation apparatus of an autonomously navigating work machine (hereinafter called "apparatus"). In this embodiment, the autonomously navigating work machine (hereinafter called "work machine 10") is a lawnmower, like that best shown in FIG. 2. Although a single work machine 10 suffices, this embodiment assumes use of multiple work machines (e.g., three machines, as shown in FIG. 1), each of which is assigned to service its own work area AR.

The apparatus 1 is equipped with a computer 2. As shown in FIG. 3, the computer 2 comprises a processor (CPU) 2a, a memory 2*b* and an input/output circuit (I/O) 2*c*, which are interconnected through a bus. A display 4, and a keyboard, mouse, touch panel and other input equipment 6 are connected to the computer 2.

A simulation program 2*b*1 for simulating work of at least one work machine 10 in the work area AR is loaded in the memory 2*b* of the computer 2. The simulation program 2*b*1 is an interactive program that allows a user or other operator to perform simulation in accordance with conditions inputted through the input equipment 6 and that displays the results on the display 4.

There now follows an explanation of the work machine 10 with reference to FIG. 2 onward. A body (base member) 12 of the work machine 10 comprises a chassis 12*a* and a frame 12*b* attached to the chassis 12*a*. The work machine 10 is equipped with two (left and right) front wheels 14 of relatively small diameter fixed through stays 12*a*1 to longitudinal (fore-aft) front end of the chassis 12*a* and with left and right rear wheels 16 of relatively large diameter directly attached to rear end of the chassis 12*a*.

A lawn mower work blade (work unit; hereinafter sometimes called "blade") 20 is attached to the chassis 12*a* near the middle thereof and an electric motor (hereinafter called "work motor") 22 is installed above it. The blade 20 is connected to the work motor 22 and driven to rotate thereby. A blade height regulation mechanism 24 manually operable by a user is connected to the blade 20. (Blade height can optionally be power regulated rather than manually.)

Two electric motors (drive units; hereinafter called "propulsion motors") 26L and 26R are attached to the chassis 12*a* rearward of the blade 20. The propulsion motors 26L and 26R are connected to the left and right rear wheels 16 and rotate the rear wheels 16 normally or reversely independently on the left and right.

The work machine 10 is of such weight and size as to be portable by the user. For example, the work machine 10 has a total length (fore-aft length) of about 71 cm, total width of about 55 cm, and height of about 30 cm. An onboard charging unit 30 and an onboard battery 32 connected thereto are housed at the rear of the work machine 10, and two battery charging terminals 34 are attached to the frame 12*b* so as to project forward in running direction. The work motor 22 and propulsion motors 26 are connected to the onboard battery 32 and are powered thereby. Related wiring is not illustrated (is omitted) in FIG. 1.

Two cameras (photographic equipment) 36 are installed on the front end of the work machine 10 to enable forward or stereographic (360°) observation. And a contact sensor 40 attached to the frame 12*b* outputs an ON signal when the frame 12*b* detaches from the chassis 12*a* upon striking against an obstacle or foreign body.

A housing box (not shown) installed near the middle of the work machine 10 houses a printed circuit board 42 carrying an electronic control unit (hereinafter sometimes called "ECU") 44. As shown in FIG. 5, the ECU 44 comprises a microcomputer equipped with at least a CPU (processor) 44*a*, memory (ROM, EEPROM and RAM) 44*b* and I/O (input/output circuit) 44*c*.

The printed circuit board 42 is further provided thereon, in the vicinity of the ECU 44, with an angular velocity sensor 46 that generates an output indicating angular velocity (yaw rate) around a center-of-gravity z-axis (gravity axis) of the work machine 10, an acceleration sensor 50 that generates an output indicating acceleration acting on the work machine 10 in orthogonal three-axis (x, y and z) directions, and a direction sensor 52 that generates an output indicating absolute orientation in response to terrestrial magnetism.

Wheel speed sensors 54 installed near the left and right rear wheels 16 of the work machine 10 generate outputs indicating wheel speeds of the left and right rear wheels 16, and a lift sensor 56 installed between the chassis 12*a* and the frame 12*b* outputs an ON signal when the frame 12*b* is lifted (raised) off the chassis 12*a* by someone such as the user. A current sensor 60 installed on the onboard battery 32 generates an output indicating consumption of onboard battery 32 current.

The work machine 10 is equipped with a main switch 62 for instructing start of work operation and the like and an emergency stop switch 64 for instructing emergency stop, both of which are operable by the user. In addition, the frame 12*b* of the work machine 10 has a large cutaway in its upper surface, in which a keyboard, touch panel or other input device 66 is installed for input of instructions and the like by the user, and a display 70 is also installed.

The input device 66 and the display 70 are connected to the ECU 44, and the display 70 displays working modes and other various information in accordance with commands from the ECU 44. Moreover, the ECU 44 is configured to communicate through the I/O 44*c* with the computer 2 of the apparatus 1, by wire or wirelessly, by means of a communication terminal 72, as shown in FIG. 3. The communication terminal 72 is a smartphone or other such PDA (Portable Digital Assistant) with communication function.

As shown in FIG. 5, outputs of the cameras 36, contact sensor 40, angular velocity sensor 46 and other sensors and outputs of the main switch 62 and other switches are sent to the ECU 44 and inputted through the I/O 44*c*. Outputs of the cameras 36 are similarly sent to an ECU-equipped image processing unit 36*a*, in which captured images are generated.

FIG. 6 is an explanatory bird's eye view of a work area AR. The work area AR can be divided into multiple zones ARn (e.g., AR1, AR2 and AR3) demarked by boundaries (boundary lines) 74. A charging station (hereinafter called charging ST) 76 for charging the onboard battery 32 of the work machine 10 is installed in the working area AR.

The work area AR, which for simplification of illustration is shown only partially in the drawing, is defined in its entirety in the memory 2*b* by a map MP that has its origin at the position of the charging ST 76 and is formed by arraying multiple cells Cmp in a biaxial orthogonal coordinate system (XY plane) of uniformly spaced horizontal and perpendicular lines referenced with respect to direction determined by the direction sensor 52.

In the actual work area AR, markers formed like, for example, triangular blocks are placed at appropriate intervals along the perimeter and the boundaries 74, and the ECU 44 recognizes the full work area AR by detecting the markers from captured images generated by the image processing unit 36*a*.

Moreover, the ECU 44 supplies power of the onboard battery 32 to the propulsion motors 26 based on the other sensor outputs and outputs control values through the I/O 44*c* so as to run the propulsion motors 26 and control the work machine 10 to perform lawn mowing as it autonomously navigates in the work area AR.

Returning to FIG. 3 to continue explanation of the computer 2 of the apparatus 1, the processor 2*a* in the computer 2 performs as a boundary demarcation unit 2*a*1 that demarcates the boundaries 74 which divide the work area AR into multiple zones ARn, a simulation execution unit 2*a*2 that executes simulation of work performed by three work machines 10 in multiple zones ARn divided by boundaries 74 demarcated by the boundary demarcation unit 2a1, a boundary re-demarcation unit 2a3 that re-demarcates boundaries demarcated by the boundary demarcation unit 2a1 based on results of simulation executed by the simulation execution unit 2a2, a zone display unit 2a4 that displays multiple zones ARn of the work area AR divided in accordance with boundaries re-demarcated by the boundary re-demarcation unit 2a3, and a work instruction unit 2a5 that instructs at least one work machine 10 to perform work in multiple zones ARn of the work area AR divided in accordance with boundaries re-demarcated by the boundary re-demarcation unit 2a3.

For convenience of illustration, the number of work machines 10 and the number of zones ARn are both defined as three in this embodiment, but, needless to say, neither the number of work machines 10 nor the number of work region zones ARn is limited to three. To give a specific example, a single work machine 10 can sequentially service multiple zones ARn at staggered times.

Figure 7:
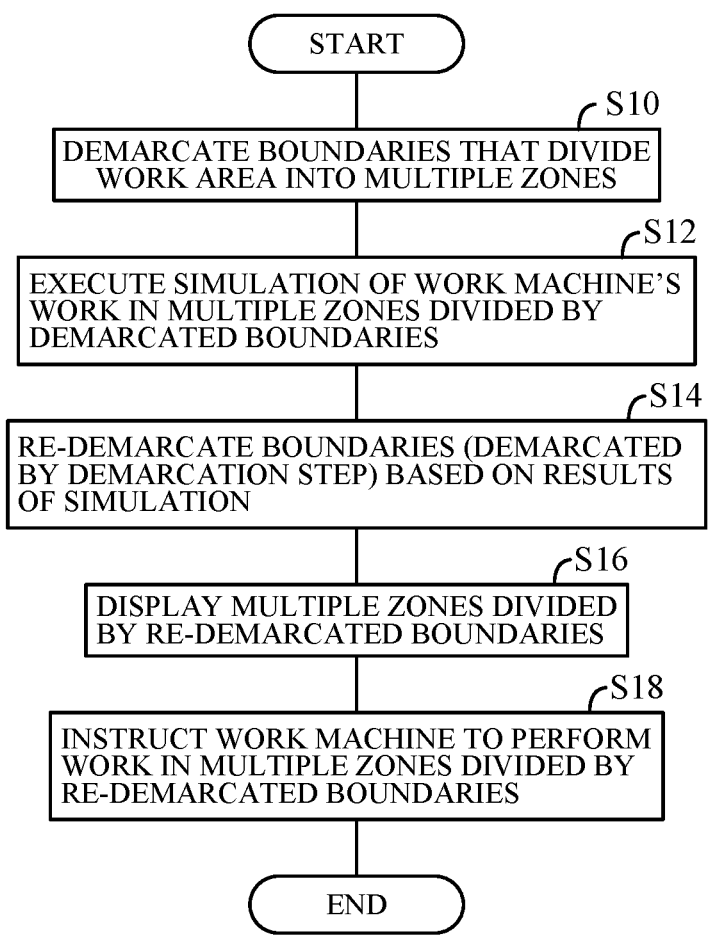
FIG. 7 is a flowchart concretely indicating processing performed by the processor of the computer of the work area zone boundary demarcation apparatus of FIG. 1.

FIG. 7 is a flowchart concretely indicating processing performed by the processor 2a of the computer 2 of the work area zone boundary demarcation apparatus 1.

Now to explain, in S10, boundaries 74 that divide the work area AR into multiple zones ARn are demarcated (processing performed by the boundary demarcation unit 2a1).

Specifically, the boundary demarcation unit 2a1 first tentatively demarcated the boundaries 74. For example, as shown in FIG. 6, the boundary demarcation unit 2a1 randomly demarcates two points a and b on the perimeter of the work area AR, whose positions can be set by proximity to some point or be set to make area fraction of the respective zones equal.

Figure 8:
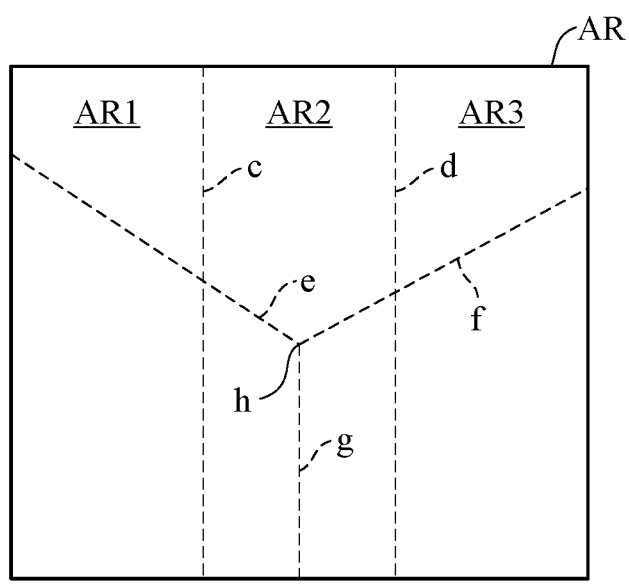
FIG. 8 is still an explanatory diagram of a work area to be serviced by the autonomously navigating work machine of FIG. 1.

In addition, the boundary demarcation unit 2a1 demarcates the boundaries 74 so as to minimize intersections between the boundaries 74. As is clear from the example shown in FIG. 8, when the case of using straight lines c and d each comprising of a single straight line segment is compared to the case of using straight lines e, f and g each comprising of a segment of a bent straight line, it is seen that the former case has 0 straight line intersections while the latter case has 1 straight line intersection (h).

In the division according to the latter case having more intersections than in the former case, shape of the area becomes complicated, and since there come to be fewer maximum length straight line distances in the area, the work machine 10 has to make more laps and work time increases in proportion. Accordingly, when the boundary 74 can be defined by any among a number of straight line segments, efficiency is improved by defining the boundary 74 using the longest straight line segment.

As shown in FIG. 6, the work area AR often includes a narrow path 80 of constricted passage width for the work machine 10, but the boundary demarcation unit 2a1 is configured to demarcate the boundaries 74 so as to minimize area of the narrow path 80 (i.e., number of the narrow paths 80 if plural).

The narrow path 80 is by definition a passageway of width w not less than n times greater than and less than m times greater than lateral width of the work machine 10 (left-right direction width perpendicular to fore-aft center line CL1 of body in FIG. 3). The boundary demarcation unit 2a1 is configured to demarcate the boundaries 74 so as to minimize area or number of such narrow paths 80.

Figure 9:
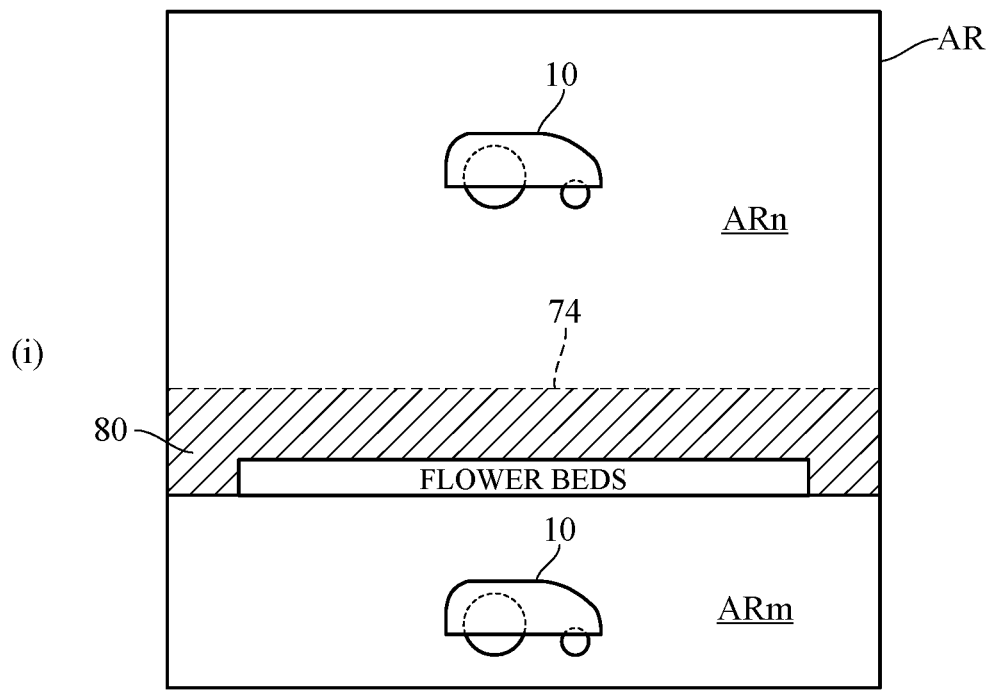
FIG. 9 is yet an explanatory diagram of a work area to be serviced by the autonomously navigating work machine of FIG. 1.
Figure 9:
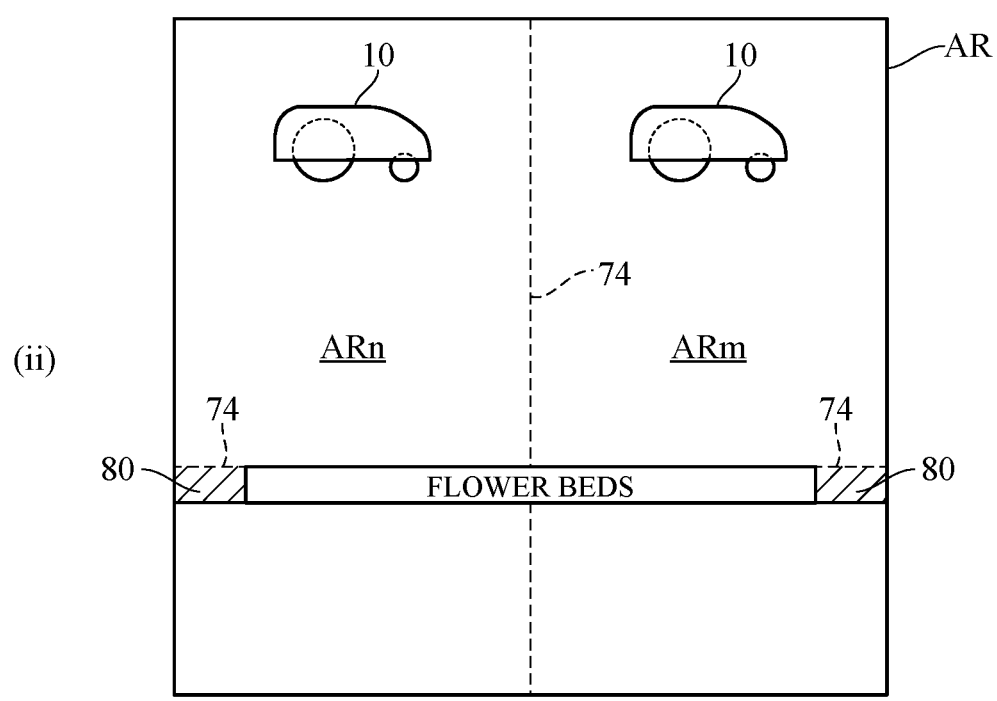

Now to explain this with reference to FIG. 9, which is a set of diagrams (i) and (ii) for explaining change of narrow path 80 area by boundary 74 in the diagrams, an example is illustrated in which area of narrow path 80 is greater in (i) than in (ii). As area of the narrow path 80 is desirably made as small as possible, (ii) is preferable in the case shown in FIG. 9. In FIG. 9, ARn and Arm are two among AR1, AR2 and AR3 of FIGS. 6 and 8.

In addition, the boundary demarcation unit 2a1 ascertains the positions of flower beds, trees, ponds and other unserviceable regions 82 in the work area AR from the cells Cmp of the map MP in response to input from the user or other operator and demarcates the boundaries 74 taking the ascertained unserviceable regions 82 into account.

Moreover, the boundary demarcation unit 2a1 is configured to update data regarding the work area AR at predetermined intervals such as every half year. Specifically, the boundary demarcation unit 2a1 determines at predetermined time intervals whether information including data regarding changes to the shape of the work area AR owing to construction, sale or other cause was inputted by the user, for example, and responds to such data having been inputted by updating the information regarding the work area AR.

Returning to the explanation of the flowchart of FIG. 7, next, in S12, simulation of work performed by at least one work machine 10 in the three zones ARn divided by the demarcated boundaries 74 is executed (processing performed by the simulation execution unit 2a2).

Now to explain, when the simulation execution unit 2a2 performs simulation of work of at least one work machine 10 in the three zones ARn divided by the boundaries 74 demarcated by the boundary demarcation unit 2a1 in S10, it displays work time of the at least one work machine 10 on the display 4.

Moreover, when the simulation execution unit 2a2 executes simulation of work of at least one work machine 10 in the three zones ARn divided by the boundaries 74 demarcated by the boundary demarcation unit 2a1 in S10, it also includes in the simulation travel time of the at least one work machine 10 between starting from a predetermined position (start point, e.g., charging ST 76) and arriving at its assigned zone ARn.

In addition, after the boundary demarcation unit 2a1 updates data regarding the work area AR, the simulation execution unit 2a2 again executes simulation of work of at least one working machine 10 in the multiple zones ARn divided by the boundaries 74 demarcated based on the updated data.

Returning to the explanation of the flowchart of FIG. 7, next, in S14, the boundaries 74 demarcated by the boundary demarcation unit 2a1 in S10 are re-demarcated based on results of the simulation executed by the simulation execution unit (step) 2a2 in S12 (processing performed by the boundary re-demarcation unit 2a3).

The reasoning here is that since the boundary demarcation unit 2a1 only tentatively demarcates the boundaries 74 in S10 at the start of the processing, the results of the simulation executed by the simulation execution unit 2a2 are highly likely to lead to the conclusion that the workloads of the three zones ARn divided by the tentative boundaries 74 demarcated by the boundary demarcation unit 2a1 in S10 are not equal.

Therefore, when it is determined from the results of the simulation executed by the simulation execution unit 2a2 in S12 that the workloads of the three zones ARn divided by the boundaries 74 demarcated by the boundary demarcation unit 2a1 in S10 are not equal, the boundary re-demarcation unit 2a3 re-demarcates the boundaries 74 demarcated by the boundary demarcation unit 2a1 and the simulation execution unit 2a2 again executes simulation of work of at least one work machine 10 in the multiple zones ARn divided by the re-demarcated boundaries 74.

The simulation execution unit 2a2 thus re-executes simulation of work of at least one working machine 10 in the three zones ARn divided by the boundaries 74 re-demarcated by the boundary re-demarcation unit 2a3.

Moreover, when it is determined from the results of the simulation executed by the simulation execution unit 2a2 that an unserviced region remains in any of the work region zones ARn, the boundary re-demarcation unit 2a3 re-demarcates the boundaries demarcated by the boundary demarcation unit 2a1 so that the unserviced region comes to be included in an adjacent region and the simulation execution unit 2a2 again executes simulation of work of at least one work machine 10 in the multiple zones ARn divided by the re boundaries 74.

Figure 10:
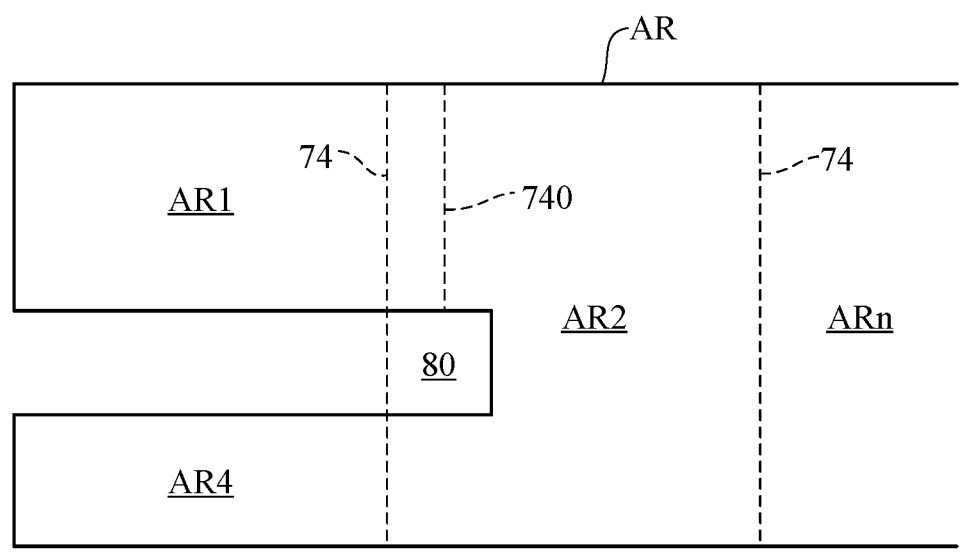
FIG. 10 is yet still an explanatory diagram of a work area to be serviced by the autonomously navigating work machine of FIG. 1.

For example, assume that when work zones AR1 and AR2 are divided by a boundary 74 in S10, as shown in FIG. 10, a resulting region AR4 adjacent to a narrow path 80 becomes an unserviced region.

In such a case, therefore, a boundary 740 terminating ahead of the narrow path 80 is newly in place of the boundary 74 so that the unserviced region AR4 comes to be included in the work zone AR2 and simulation is executed in the new zone composed of AR4+AR2 created by the newly demarcated boundary 740.

Although the shape of the work area AR in the explanation of this embodiment appears different among FIGS. 1, 6, 8, 9 and 10, this is solely for convenience of illustration and explanation, and the actual work area AR is of one and the same shape.

Returning to the explanation of the flowchart of FIG. 7, next, in S16, the multiple zones divided by the boundaries re-demarcated by the boundary demarcation unit 2a3 are displayed (processing performed by the zone display unit 2a4 that results in display content nearly the same as that of FIG. 6).

Next, in S18, at least one work machine 10 is prompted by an instruction to its ECU 44 to perform work in the multiple zones divided by the boundaries re-demarcated by the boundary re-demarcation unit 2a3 (work prompted by the work instruction unit 2a5).

Owing to its aforesaid configuration, the zone boundary demarcation apparatus 1 of the work machine 10 according to the first embodiment can achieve improved efficiency when at least one work machine 10 performs work in a work area AR divided or demarcated into multiple zones ARn.

Second Embodiment

Figure 11:
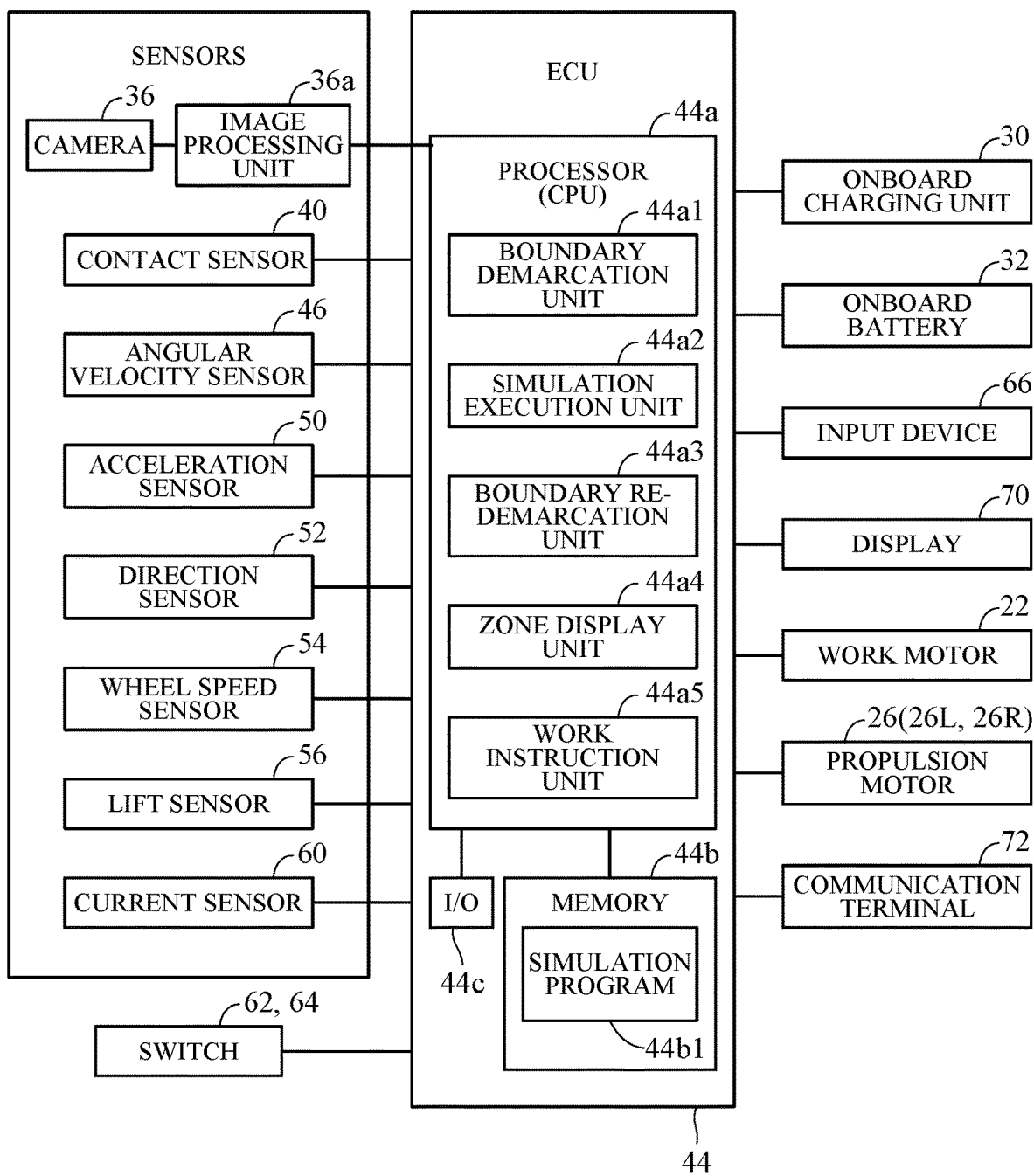
FIG. 11 is a block diagram, similar to FIG. 5, but showing a work zone boundary demarcation apparatus of an autonomously navigating work machine according to a second embodiment of this invention and indicating input-output relationships of an ECU of the work machine.

FIG. 11 is a block diagram similar to FIG. 5 showing a work zone boundary demarcation apparatus of an autonomously navigating work machine according to a second embodiment of this invention and indicating input-output relationships of the ECU 44 of the work machine 10.

As illustrated with respect to the second embodiment, at least one work machine 10 driven by propulsion motors 26 to be capable of autonomously navigating a work area AR comprises an ECU 44 constituted as a computer incorporating at least a processor 44a, a memory 44b and an input-output circuit 44c, and, similarly to what was explained with reference to FIG. 3 regarding the first embodiment, the memory 44b is loaded with a simulation program 44b1, similar to the simulation program 2b1, for simulating work of at least one work machine 10 in a work area.

Moreover, the processor 44a is configured to perform as a boundary demarcation unit 44a1, simulation execution unit 44a2, boundary re-demarcation unit 44a3, zone display unit 44a4 and work instruction unit 44a5 respectively similar to the boundary demarcation unit 2a1, simulation execution unit 2a2, boundary re-demarcation unit 2a3, zone display unit 2a4 and work instruction unit 2a5 of FIG. 3.

As the work zone boundary demarcation apparatus 1 of the autonomously navigating work machine 10 according to the second embodiment is configured as described in the foregoing, it can, like the apparatus 1 of the first embodiment, achieve improved efficiency when at least one work machine 10 works in the work area AR divided into multiple zones ARn, and while its accuracy of simulation is slightly inferior to that of the first embodiment, it is advantageous for its simpler structure. Its other features and effects are no different from those of the first embodiment.

As described in the foregoing, the first and second embodiments of this invention is configured to have a work zone boundary demarcation apparatus (1) to demarcate boundaries (74) that divide a work area (AR) to be serviced by at least one autonomously navigating work machine (10) into multiple zones (ARn), comprising a computer (2, 44) having at least a processor (2a, 44a), a memory (2b, 44b), an input-output circuit (2c, 44c) and a simulation program (2b1, 44b1) loaded in the memory to simulate work of the work machine (10) in the work area, wherein the processor (2a, 44a) is configured to perform as a boundary demarcation unit (2a1, 44a1, S10) that demarcates boundaries which divide the work area into multiple zones, a simulation execution unit (2a2, 44a2, S12) that executes simulation of work of the work machine in the multiple zones divided by the boundaries demarcated by the boundary demarcation unit, a boundary re-demarcation unit (2a3, 44a3, S14) that re-demarcates boundaries demarcated by the boundary demarcation unit based on results of the simulation executed by the simulation execution unit, and a zone display unit (2a4, 44a4, S16) that displays the multiple zones divided by the boundaries re-demarcated by the boundary re-demarcation unit. With this, work times of the work machine 10 in the multiple zones ARn can be equalized by, for example, instructing the work machine 10 based on the display, so that efficiency when performing work by at least one work machine 10 can be improved by dividing a large work area AR into multiple zones ARn. The assumption in this context is that in the case of a single work machine 10, the multiple zones ARn are sequentially serviced at staggered times, and in the case of multiple work machines 10, each of the multiple zones is serviced by one of them. Although these embodiments are explained for the case of servicing each of multiple zones ARn with a single work machine 10, the embodiment is not limited to this mode and it is alternatively possible to service individual zones with multiple working machines 10.

Moreover, it is configured such that the apparatus includes a work instruction unit (2a5, 44a5, S18) that instructs the work machine(s) (10) to perform work in the multiple zones divided by the boundaries re-demarcated by the boundary re-demarcation unit. With this, work times of the work machine(s) 10 in the multiple zones ARn can, as stated earlier, be equalized to enable improved efficiency when a large work area AR is divided into multiple zones ARn and serviced.

In addition, it is configured such that the simulation execution unit (2a2, 44a2) re-executes simulation of work of the work machine in the multiple zones divided by the boundaries re-demarcated by the boundary re-demarcation unit (S12). With this, the boundaries can be re-demarcated again based on the simulation results to more accurately equalize work times and still more thoroughly improve efficiency when dividing and servicing a large work area AR.

Furthermore, it is configured such that when workloads of the multiple zones divided by the boundaries demarcated by the boundary demarcation unit are determined from the results of the simulation executed by the simulation execution unit not to be equal, the boundary re-demarcation unit (2a3, 44a3) re-demarcates the boundaries demarcated by the boundary demarcation unit and the simulation execution unit re-executes simulation of work of the work machine in the multiple zones divided by the re-demarcated boundaries (S14, S10). With this, work times can be more accurately equalized to still more thoroughly improve efficiency when dividing and servicing a large work area AR.

Moreover, it is configured such that the boundary demarcation unit (2a1, 44a1) ascertains an unserviceable region(s) (82) in the work area (AR) and demarcates boundaries that divide the work area into multiple zones taking the ascertained unserviceable region(s) (82) into account (S14). With this, work times can be more accurately equalized to still more thoroughly improve efficiency when dividing and servicing a large work area AR.

Still further, it is configured such that when the boundary demarcation unit demarcates boundaries dividing the work area into multiple zones taking the unserviceable region(s) (82) into account, the simulation execution unit (2a2, 44a2) re-executes simulation of work of the work machine in the multiple zones divided by the re-demarcated boundaries (S12). With this, work times can be more accurately equalized to still more thoroughly improve efficiency when dividing and servicing a large work area AR.

In addition, it is configured such that the boundary demarcation unit (2a1, 44a1) updates data regarding the work area at predetermined intervals, and after data regarding the work area is updated by the boundary demarcation unit, the simulation execution unit (2a2, 44a2) re-executes simulation of work of the work machine in the multiple zones divided by the boundaries demarcated based on the updated data (S12). With this, work times can be more accurately equalized to still more thoroughly improve efficiency when dividing and servicing a large work area AR.

Further, it is configured such that when it is determined from the results of simulation executed by the simulation execution unit that an unserviced region (AR4) remains in any of the multiple zones, the boundary re-demarcation unit (2a3, 44a3) re-demarcates the boundaries demarcated by the boundary demarcation unit so as to include the unserviced region (AR4) in an area (AR2) adjacent to the unserviced region (AR4) and the simulation execution unit re-executes simulation of work of the work machine in the multiple zones divided by the re-demarcated boundaries (S14, S12). With this, in addition to the aforesaid effects, occurrence of unserviced regions can be effectively prevented.

Moreover, it is configured such that the apparatus includes a display (4, 70) connected to the computer and the boundary demarcation unit (2a1, 44a1) displays the demarcated boundaries on the display. With this, in addition to the aforesaid effects, equalization of the divided zones can be visually monitored.

Moreover, it is configured such that the apparatus includes a display (4, 70) connected to the computer and the simulation execution unit (2a2, 44a2) displays work time of the work machine on the display at the time of executing simulation of work time of the work machine in the multiple zones divided by the boundaries demarcated by the boundary demarcation unit. With this, in addition to the aforesaid effects, equalization of the divided zones can be visually monitored.

In addition, it is configured such that when executing simulation of work of the work machine in the multiple zones divided by the boundaries demarcated by the boundary demarcation unit, the simulation execution unit (2a2, 44a2) includes in simulation travel time of the work machine up to arrival at the zone (S12). With this, work times can be more accurately equalized to still more thoroughly improve efficiency when dividing and servicing a large work area AR.

Still further, it is configured such that the boundary demarcation unit (2a1, 44a1) demarcates the boundaries dividing the work area into multiple zones so as to minimize intersections between the boundaries (S10). With this, in addition to the aforesaid effects, number of laps made by the work machine 10 while working can be reduced to still more thoroughly improve efficiency when dividing and servicing a large work area AR.

In addition, it is configured such that when the boundary can be defined by any among a number of straight line segments, the boundary demarcation unit (2a1, 44a1) demarcates the boundary dividing the work area into multiple zones using the longest line segment among the multiple line segments (S10). With this, in addition to the aforesaid effects, number of laps made by the work machine 10 can be reduced to still more thoroughly improve efficiency when dividing and servicing a large work area AR.

Moreover, it is configured such that the boundary demarcation unit (2a1. 44a1) demarcates the boundaries dividing the work area into multiple zones so as to minimize area of a narrow path(s) (80) of the work area (S10). With this, in addition to the aforesaid effects, work in the narrow path(s) 80 can be reduced to still more thoroughly improve efficiency when dividing and servicing a large work area AR.

Further, the first embodiment of this invention is configured such that the work machine (10) is equipped with a computer (ECU 44) comprising at least a processor (44a), memory (44b) and input/output circuit (44c), and the zone display unit (2a4) instructs the processor (44a) of the computer (ECU 44) of the work machine (10) via the input/output circuit (2c) to display the multiple zones divided based on boundaries re-demarcated by the boundary re-demarcation unit (S16). With this, in addition to the aforesaid effects, it becomes possible, by executing simulation more accurately using a mainframe or other computer 2 instead of the computer (ECU 44) installed in the work machine 10, to improve efficiency when servicing a large work area AR divided into multiple zones ARn.

Moreover, the second embodiment of this invention is configured such that the work machine (10) is driven by drive units (electric motors 26) to be capable of autonomous navigation in the work area, and is equipped with a computer (ECU 44) comprising a processor (44a), memory (44b) and input/output circuit (44c), and wherein the memory (44b) is loaded with a simulation program (44b1) that simulates work of the work machine in the work area and wherein the processor 44a is configured to perform as the boundary demarcation unit (44a1), simulation execution unit (44a2), boundary re-demarcation unit (44a3) and work instruction unit (44a4). With this, in addition to the aforesaid effects, it becomes possible by means of a simple configuration to perform simulation and thereby achieve improved efficiency when servicing a large work area AR divided into multiple zones ARn.

Although the work machine 10 is applied as a lawn mowing machine in the foregoing description, this invention is not limited to this application but can also be applied to any of various other kinds of autonomously navigating work units.

INDUSTRIAL APPLICABILITY

The work zone boundary demarcation apparatus of autonomously navigating work machine according to this invention can be used suitably in simulation related to autonomously navigating work machines.

DESCRIPTION OF SYMBOLS 1 work area zone boundary demarcation apparatus of an autonomously navigating work machine, 2 computer, 2a processor, 2a1 boundary demarcation unit, 2a2 simulation execution unit, 2a3 boundary re-demarcation unit, 2a4 zone display unit, 2a5 work instruction unit, 2b memory, 2b1 simulation program, 2c input/output circuit, 4 display, 6 input equipment, 10 autonomously navigating work machine (work machine), 12 body, 14 front wheels, 16 rear wheels, 20 blade (work unit), 22 electric motor (work motor), 24 blade height regulation mechanism, 26 electric motor (propulsion motor), 30 onboard charging unit, 32 onboard battery, 34 battery charging terminals, 36 camera, 36a image processing unit, 44 electronic control unit (ECU), 44a processor, 44a1 boundary demarcation unit, 44a2 simulation execution unit, 44a3 boundary re-demarcation unit, 44a4 zone display unit, 44a5 work instruction unit, 44b memory, 44b1 simulation program, 46 angular velocity sensor, 50 acceleration sensor, 52 direction sensor, 66 input device, 70 display, 72 communication terminal, 74 boundary, 76 charging station (ST), 80 narrow path, 82 unserviceable region

The invention claimed is:

1. A work zone boundary demarcation apparatus to demarcate boundaries that divide a work area to be serviced by at least one autonomously navigating work machine into multiple zones, comprising:
   a computer having at least a processor, a memory, an input-output circuit and a simulation program loaded in the memory to simulate work of the work machine in the work area, wherein
   the processor is configured to perform:
   demarcating the boundaries that divide the work area into the multiple zones;
   executing simulation of work of the work machine in the multiple zones divided by the boundaries;
   equalizing work times of the work machine when dividing and servicing the work area by re-demarcating the boundaries when workloads of the multiple zones divided by the boundaries are determined not to be equal based on results of the simulation,
   improving efficiency of the work machine by equalizing work times of the work machine using the boundaries as re-demarcated; and
   displaying the multiple zones divided by the boundaries as re-demarcated.

2. The apparatus according to claim 1, wherein the processor is further configured to perform:
   instructing the work machine to perform work in the multiple zones divided by the boundaries as re-demarcated.

3. The apparatus according to claim 2, wherein the work machine is equipped with a computer comprising at least a processor, memory and input/output circuit, wherein
   the instructing includes instructing the processor of the computer of the work machine via the input/output circuit to display the multiple zones divided based on the boundaries as re-demarcated.

4. The apparatus according to claim 1, wherein the executing includes re-executing the simulation of work the multiple zones divided by the boundaries as re-demarcated.

5. The apparatus according to claim 1, wherein the demarcating includes ascertaining an unserviceable region in the work area and demarcating the boundaries that divide the work area into the multiple zones taking the ascertained unserviceable region into account.

6. The apparatus according to claim 5, wherein the executing includes re-executing the simulation when the boundaries are demarcated taking the unserviceable region into account.

7. The apparatus according to claim 1, wherein the demarcating includes updating data regarding the work area at predetermined intervals, and the executing includes re-executing the simulation in the multiple zones divided by the boundaries demarcated based on the updated data.

8. The apparatus according to claim 1, further comprising:
   a display connected to the computer, wherein the displaying includes displaying the boundaries on the display.

9. The apparatus according to claim 1, further comprising:
   a display connected to the computer, wherein
   the executing includes displaying work time of the work machine on the display at the time of executing the simulation.

10. The apparatus according to claim 1, wherein the executing includes including a travel time of the work machine up to arrival at the zone in the simulation.

11. The apparatus according to claim 1, wherein the demarcating includes demarcating the boundaries so as to minimize intersections between the boundaries.

12. The apparatus according to claim 1, wherein
   the boundary can be defined by any among a number of straight line segments, wherein
   the demarcating includes demarcating the boundary using the longest line segment among the multiple line segments.

13. The apparatus according to claim 1, wherein the demarcating includes demarcating the boundaries so as to minimize an area of a narrow path of the work area.

14. The apparatus according to claim 1, wherein the work machine is driven by drive units capable of autonomous navigation in the work area, and is equipped with the computer.

15. A work zone boundary demarcation apparatus to demarcate boundaries that divide a work area to be serviced by at least one autonomously navigating work machine into multiple zones, comprising:
   a computer having at least a processor, a memory, an input-output circuit and a simulation program loaded in the memory to simulate work of the work machine in the work area, wherein
   the processor is configured to perform:
   demarcating the boundaries that divide the work area into the multiple zones;

executing simulation of work of the work machine in the multiple zones divided by the boundaries as demarcated;

equalizing work times of the work machine when dividing and servicing the work area by:

when it is determined from the results of the simulation that an unserviced region remains in any of the multiple zones, re-demarcating the boundaries as demarcated so as to include the unserviced region in an area adjacent to the unserviced region;

improving efficiency of the machine by equalizing work times of the work machine using the boundaries as re-demarcated; and displaying the multiple zones divided by the boundaries as re-demarcated.

16. A work zone boundary demarcation method to demarcate boundaries that divide a work area to be serviced by at least one autonomously navigating work machine into multiple zones, comprising the steps of:

demarcating the boundaries that divide the work area into the multiple zones;

executing simulation of work of the work machine in the multiple zones divided by the boundaries as demarcated;

equalizing work times of the work machine when dividing and servicing the work area by re-demarcating the boundaries when workloads of the multiple zones divided by the boundaries are determined not to be equal based on results of the simulation, improving efficiency of the work machine by equalizing work times of the work machine using the boundaries as re-demarcated; and displaying the multiple zones divided by the boundaries as re-demarcated.

17. The method according to claim 16, further including the step of:

instructing the work machine to perform work in the multiple zones divided by the boundaries as re-demarcated.

18. The method according to claim 16, wherein the executing includes re-executing simulation of work of the work machine in the multiple zones divided by the boundaries as re-demarcated.

* * * * *